United States Patent
Jennings et al.

(10) Patent No.: US 9,435,036 B2
(45) Date of Patent: Sep. 6, 2016

(54) SILICATE COATINGS

(71) Applicant: MCT Holdings Limited, Road Town (VG)

(72) Inventors: Hamlin Jennings, Cambridge, MA (US); Michał Szczęśniak, London (GB)

(73) Assignee: MCT Holdings LTD (VG)

( * ) Notice: Subject to any disclaimer, the term of this patent is extended or adjusted under 35 U.S.C. 154(b) by 0 days.

(21) Appl. No.: 14/656,802

(22) Filed: Mar. 13, 2015

(65) Prior Publication Data

US 2016/0068967 A1 Mar. 10, 2016

Related U.S. Application Data (60) Provisional application No. 62/047,280, filed on Sep. 8, 2014.

(51) Int. Cl.
| | | |
|---|---|---|
| *B32B 15/04* | (2006.01) | |
| *B32B 17/06* | (2006.01) | |
| *C23C 28/04* | (2006.01) | |
| *C23C 14/08* | (2006.01) | |
| *C25D 11/18* | (2006.01) | |
| *C25D 9/06* | (2006.01) | |
| *C23C 14/58* | (2006.01) | |

(52) U.S. Cl.
CPC ............ *C23C 28/04* (2013.01); *C23C 14/081* (2013.01); *C23C 14/5846* (2013.01); *C25D 9/06* (2013.01); *C25D 11/18* (2013.01)

(58) Field of Classification Search
USPC ....... 428/426, 428, 432, 433, 434, 688, 689, 428/697, 699, 701, 702
See application file for complete search history.

(56) References Cited

U.S. PATENT DOCUMENTS

| | | | |
|---|---|---|---|
| 3,499,780 | A | 3/1970 | Etherington et al. |
| 3,625,737 | A * | 12/1971 | Ricchezza ............. C25D 11/24 148/272 |
| 3,944,440 | A | 3/1976 | Franz |
| 3,971,674 | A | 7/1976 | Brandt et al. |
| 4,115,607 | A | 9/1978 | Hasegawa et al. |
| 4,125,651 | A | 11/1978 | Campbell et al. |
| 4,169,735 | A | 10/1979 | Blasko et al. |
| 4,225,398 | A | 9/1980 | Hasegawa et al. |
| 4,347,285 | A | 8/1982 | Batdorf |
| 4,379,196 | A | 4/1983 | Halper |

(Continued)

FOREIGN PATENT DOCUMENTS

EP 1873278 A1 1/2008

OTHER PUBLICATIONS

International Search Report and Written Opinion of PCT/US15/20325, Jun. 12, 2015.

*Primary Examiner* — Lauren R Colgan
(74) *Attorney, Agent, or Firm* — Synthesis Intellectual Property, LLC (57) ABSTRACT

Metal products having improved properties and processes for preparing the metal products are provided. The present disclosure provides for a metal product comprising a metal surface, an oxide layer and a glass layer. The glass layer is provided by coating a stable aqueous silicate or borosilicate solution onto the metal surface and curing the aqueous solution to produce a glass layer. The metal products have surface characteristics that outperform all anodized metal surfaces.

11 Claims, 7 Drawing Sheets

(56) References Cited

U.S. PATENT DOCUMENTS

| | | |
|---|---|---|
| 4,415,364 A | 11/1983 | Naito et al. |
| 4,601,796 A | 7/1986 | Powers et al. |
| 4,762,753 A | 8/1988 | Perfetti |
| 4,792,358 A | 12/1988 | Kimura et al. |
| 4,894,127 A | 1/1990 | Wong et al. |
| 5,205,874 A | 4/1993 | Crews, IV et al. |
| 5,306,526 A | 4/1994 | Gray et al. |
| 5,492,766 A | 2/1996 | Howard et al. |
| 5,681,383 A | 10/1997 | Andoh et al. |
| 5,770,315 A | 6/1998 | Wiedemann |
| 6,059,897 A | 5/2000 | Koerner et al. |
| 6,358,616 B1 * | 3/2002 | Jennings ............ C09D 1/02 428/450 |
| 6,428,616 B1 | 8/2002 | Neely, Jr. |
| 6,440,290 B1 | 8/2002 | Vega et al. |
| 6,455,100 B1 | 9/2002 | Heimann et al. |
| 6,929,705 B2 | 8/2005 | Myers et al. |
| 6,986,810 B1 | 1/2006 | Behi |
| 7,851,025 B2 | 12/2010 | Lawlor |
| 8,173,221 B2 * | 5/2012 | Jennings ............ C09D 1/02 427/397.7 |
| 2004/0191536 A1 * | 9/2004 | Heimann ............ C04B 28/26 428/446 |
| 2008/0032121 A1 * | 2/2008 | Lawlor ............ C25D 11/24 428/335 |
| 2008/0261033 A1 | 10/2008 | Binder et al. |
| 2008/0311362 A1 | 12/2008 | Binder et al. |
| 2009/0038946 A1 | 2/2009 | Ohmi et al. |
| 2009/0239065 A1 * | 9/2009 | Jennings ............ C09D 1/02 428/336 |
| 2012/0196119 A1 * | 8/2012 | Jennings ............ C09D 1/02 428/336 |
| 2012/0244280 A1 | 9/2012 | Hecht |
| 2014/0042900 A1 * | 2/2014 | Hotta ............ H01L 33/60 313/512 |

\* cited by examiner

SILICATE COATINGS

CROSS-REFERENCE TO RELATED APPLICATION

This disclosure claims the benefit of priority to U.S. Provisional Patent Application No. 62/047,280, filed 8 Sep., 2014, the disclosure of which is incorporated herein in its entirety.

FIELD OF THE INVENTION

The herein disclosed invention is directed to protective inorganic coatings for aluminum and aluminum oxides.

BACKGROUND

The electrochemical formation of oxide layers on aluminum is a well-known and widely used industrial procedure to produce protective and/or decorative coatings on aluminum and/or aluminum alloys. Electrolytically produced aluminum oxide layers protect the base metal from corrosion and weathering and furthermore may increase the surface hardness and the abrasive resistance of the aluminum part.

Many different processes of anodizing are known. For example, aluminum materials can be anodized in electrolytes such as sulfuric acid, chromic acid, phosphoric acid, and oxalic acid by the application of AC or DC currents at a bath temperature of 10-25° C. Variations in this treatment can change the thicknesses and/or hardness of the anodized aluminum oxide layer.

The porosity of the anodized layer may be favorable for the adhesion of organic coatings, but exhibits a major drawback, namely the lack of protection against corrosive media. Therefore, and to impart maximum corrosion stability, anodized aluminum layers are often sealed in a subsequent process step. During sealing, which might be a hot sealing and/or cold sealing process, the aluminum oxide becomes hydrated and is transformed from its amorphous, essentially water-free constitution to a boehmite structure. This transformation is accompanied by a volume expansion or swelling of the oxide that in turn procures the sealing of the porous structure. Hot sealing of the anodized layer is usually performed in hot water or in steam, whereas the cold sealing process is operated at temperatures close to 30° C. in the presence of nickel fluoride. Sealing improves the corrosion resistance and resistance to weathering of anodized aluminum parts in a pH range from 5-8.

Unfortunately, sealed anodized aluminum surfaces continue to display poor corrosion resistance and stability below pH 4 and/or above pH 9. Additional seals or coatings have been attempted but improved coatings with stability to high and low pH, accelerated corrosion testing, abrasion, and fogging are needed.

SUMMARY

Herein is disclosed a layered product that includes an aluminum oxide layer having a composition that is free of silicates; and a silicate glass layer directly carried by the aluminum oxide layer and having a silicate glass layer EDX composition that consists of silicon, oxygen, sodium, optionally lithium, and optionally boron; wherein the silicate glass layer EDX composition is free of aluminum.

Additionally disclosed is a process for preparing a surface coating that includes forming a coated-aluminum-oxide layer by applying an aqueous silicate solution to an aluminum oxide layer having a thickness of about 1 μm to about 25 μm, the aluminum oxide layer consisting of a sealed, anodized-aluminum layer or a hydrated PVD alumina layer, the aqueous silicate solution having a pH of about 11 to about 13, a composition that includes a ratio of $SiO_2$ to $M_2O$ of about 3.5 to about 2, where M is selected from Li, Na, K, and a mixture thereof, and a ratio of $SiO_2$ to $B_2O_3$ of about 10:1 to about 200:1; and thereafter, polymerizing and curing a silicate glass on the sealed, anodized-aluminum layer by (A) heating the coated, anodized-aluminum layer to a temperature of about 200° C. to about 500° C. or (B) exposing the coated, anodized-aluminum layer to an infrared source.

BRIEF DESCRIPTION OF THE FIGURES

For a more complete understanding of the disclosure, reference should be made to the following detailed description and accompanying drawing figures wherein.

While specific embodiments are illustrated in the figures, with the understanding that the disclosure is intended to be illustrative, these embodiments are not intended to limit the invention described and illustrated herein.

DETAILED DESCRIPTION

The present disclosure is directed to processes for manufacturing and to metal products that demonstrate excellent durability and ease of preparation. In general, a product includes a metal or metal alloy substrate, an oxide layer on the surface of the metal or metal alloy substrate, and a glass layer on the oxide layer that is a silicate or borosilicate glass. The product according to this invention may be used in interior/exterior applications such as architectural fixtures, automobile parts, aerospace parts, marine components, bicycle components, motor bike parts, heavy transport vehicle parts (including truck, train, and rail), military related components, mirrors, streetscape components (e.g., street lights and exterior signs), furniture, appliances (e.g., refrigerators, washing machine, clothing driers, dishwashers, range, table top appliances (e.g., mixers, blenders, toasters, rice makers)), solar power components (e.g., reflectors, and collectors), consumer products and related parts (e.g., cell phones, and computer components), heat exchanges, medical instruments and tools, and/or oil and gas production components (e.g., coil tubing); wherein the substrate is generally considered the fixture or part and the oxide layer and silicate glass coat the fixture or part. Architectural fixtures and parts include material for or items selected from window frames, window trim, doors, claddings, mirrors, reflectors, lamp housings, hinges, handles, furniture parts including table or chair legs, seats or tops, brackets, tracks, railings, and/or hardware. Automobile parts include members of vehicle bodies and/or vehicle wheels; including, for example, roof racks/rails, window trim, waste finisher, step/side bars, door trim, lamp trim, door handles, exhaust manifolds, reflectors, fuel cap flaps, spoilers, pillar covers, door handle anti-scratch plates, antenna, brandings/emblems, window visors, speaker trim, hub caps, wheel rims, lug nuts, engine parts (e.g., pistons, blocks, shafts, cams, pulleys, housings, and covers), and/or exhaust parts (e.g., exhaust tubing/piping, mufflers, converter covers, clamps, hangers, and tail pipes). Aerospace parts include, for example, engine covers, panels, spinners, propellers, wings, flaps, elevators, and cowlings. Marine components include, for example, hulls, masts, booms, pulleys, winch, tiller, spreaders, grabrail, turnbuckle, stanchion, hatch trim, and/or trailers. Bicycle components include, for example, frames, posts, tubes, handle bars, rims, levers, gears, and/or hubs. Motor bike parts include, for example, wheels, suspension tubes, swinging arms, engine parts, exhaust parts, and trim.

Herein is disclosed a layered product that includes an aluminum oxide layer having a composition that is free of silicates, preferably having an aluminum oxide layer EDX composition that is free of silicon, boron, and/or nickel; and a silicate glass layer directly carried by the aluminum oxide layer and having a silicate glass layer EDX composition that consists of silicon, oxygen, sodium, optionally lithium, and optionally boron; wherein the silicate glass layer EDX composition is free of aluminum. The silicate glass layer has a composition that includes about 55 wt. % to about 98 wt. % $SiO_2$, 0 wt. % to about 6.7 wt. % $B_2O_3$, and about 2.3 wt. % to about 36 wt. % $M_2O$, wherein M is selected from the group consisting of lithium, sodium, potassium, and a mixture thereof; preferably wherein M is a mixture of Li and Na, for example with a Li:Na ratio of about 1:10 to 10:1; wherein the silicate glass layer includes less than 0.1 wt. % aluminum, preferably less than 0.01 wt. % aluminum, even more preferably less than 0.001 wt. % aluminum. Preferably, the silicate glass layer has a TOF-SIMS composition that consists of silicon, oxygen, sodium, optionally lithium, and optionally boron; wherein silicate glass layer TOF-SIMS data may show a trace amount of aluminum. The silicate glass layer can have a thickness in the range of about 50 nm to about 3000 nm, about 50 nm to about 2000 nm, about 50 nm to about 1500 nm, about 100 nm to about 1500 nm, about 250 nm to about 1500 nm, or about 500 nm to about 1000 nm.

The herein disclosed aluminum oxide layer is, preferably, free of silicates. That is, the aluminum oxide layer does not include glass forming silicone oxides (e.g., $SiO_2$), aluminosilicate, borosilicates, or mixtures thereof. In one instance, the aluminum oxide layer has an EDX composition that consists of aluminum, oxygen, sulfur, and an optional colorant; and/or a TOF-SIMS composition that consists of aluminum, oxygen, sulfur, and an optional colorant. Preferably, the aluminum oxide layer TOF-SIMS composition is free of silicon.

In one instance, the aluminum oxide layer is a sealed aluminum oxide layer or a PVD aluminum oxide layer (or hydrated PVD aluminum oxide layer). In still another instance, the layered product includes an aluminum surface; wherein the aluminum oxide layer is directly attached to the aluminum surface. Preferably, the layered product still further includes a substrate, carrying the aluminum oxide layer, selected from the group consisting of aluminum, an aluminum alloy, and stainless steel.

Preferably, the layered product is free of an aluminosilicate or silicate/alumina interdiffusion. Even more preferably, the layered product passes both a 2 minute "pH 14 Test" and a "24-hour CASS Test".

Further disclosed is a coated product that includes an aluminum surface directly attached to a barrier layer. This barrier layer is directly attached to an aluminum oxide layer which is directly attached to a silicate glass layer. Herein, "directly attached" signifies and means that the denoted layers are chemically and/or physically bonded without an intervening layer. This absence of an intervening layer can be determined by spectroscopic and/or microscopic methods, for example, energy-dispersive X-ray (EDX) spectroscopy, time-of-flight secondary ion mass spectroscopy (TOF-SIMS), and/or scanning electron microscopy (SEM). Still further disclosed is a corrosion resistant coating that includes an aluminum oxide layer attached to a substrate, where the aluminum oxide layer can have a composition that includes, for example, about 70 wt. % to about 90 wt. % $Al_2O_3$, about 2.5 wt. % to about 7.5 wt. % $H_2O$, and about 10 wt. % to about 20 wt. % $SO_3$. The corrosion resistant coating can include a borosilicate glass directly attached to the aluminum oxide layer, wherein the borosilicate glass has a composition that includes $SiO_2$, $B_2O_3$, and $M_2O$. $M_2O$ is an alkali metal oxide where M is selected from the group consisting of Li, Na, K, and a mixture thereof (e.g., $Na_2O$, $Li_2O$, LiNaO, $K_2O$). Notably, the components of the borosilicate glass ($SiO_2$, $B_2O_3$, and $M_2O$) are not distinct but are part of and, preferably, homogeneously distributed throughout the glass. That is, the silicate glass layer and the aluminum oxide layer compositions are described based on recognizable components (e.g., $SiO_2$, $B_2O_3$, $Al_2O_3$) in the layers but consists of or comprise homogeneous compositions.

The composition of the silicate glass layer, based on the materials used to prepare the layer, can include about 55 wt. % to about 98 wt. % $SiO_2$, 0 wt. % to about 6.7 wt. % $B_2O_3$, and about 2.3 wt. % to about 36 wt. % $M_2O$. Notably, M is selected from the group consisting of lithium, sodium, potassium, and a mixture thereof and this selection can significantly affect the weight percentages of the component parts. For example in a composition wherein the molar ratio of the components are held constant, the variation of $M_2O$ from one hundred percent lithium, with an atomic mass of 6.941, to one hundred percent potassium, with an atomic mass of 39.098, causes a ten-fold change in the weight percentages. A preferably description of the composition of the silicate glass layer is based on molar ratios of the components, yet such a description is not common in the art. Preferably, the molar ratios of the components (expressed as percentages) are about 67% to about 81% $SiO_2$, 0% to about 7% $B_2O_3$, and about 17% to about 28% $M_2O$. Alternatively, the molar ratios can be about 75% to about 80% $SiO_2$, and about 20% to about 25% $M_2O$; or about 67% to about 76% $SiO_2$, about 3% to about 5% $B_2O_3$, and about 19% to about 30% $M_2O$.

Figure 1:
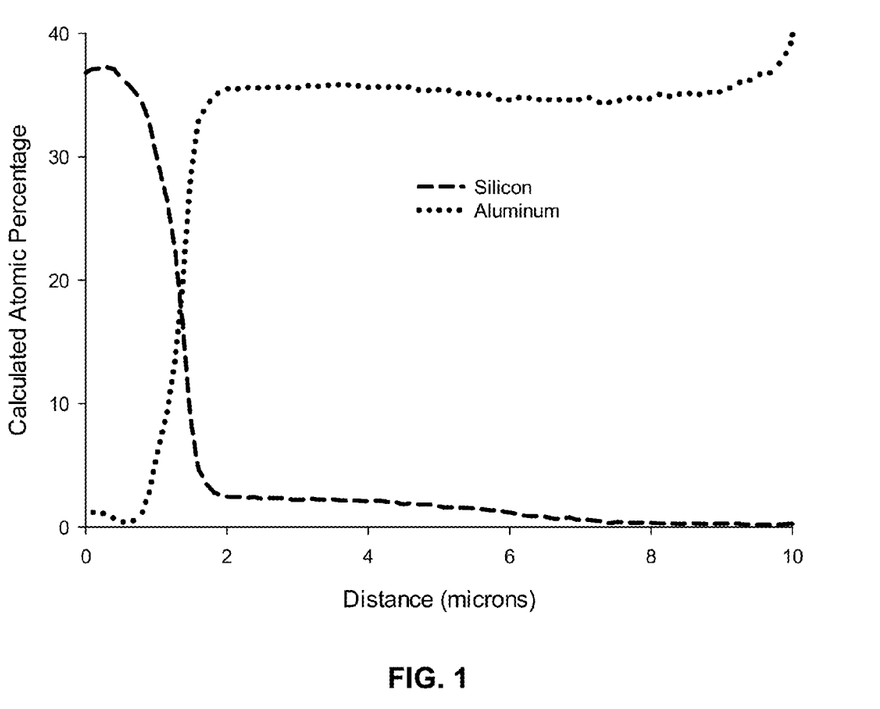
FIG. 1 is a plot of the average atomic percentages of silicon and aluminum as a function of distance from the surface of a comparative product as calculated from EDX.
Figure 2:
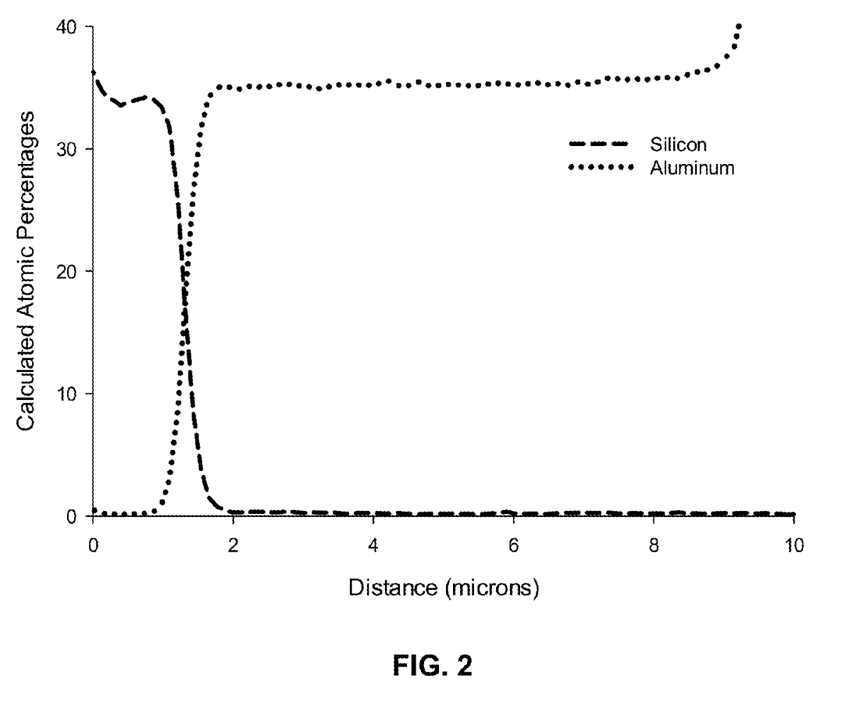
FIG. 2 is a plot of the average atomic percentages of silicon and aluminum as a function of distance from the surface of a herein-described product as calculated from EDX.
Figure 3:
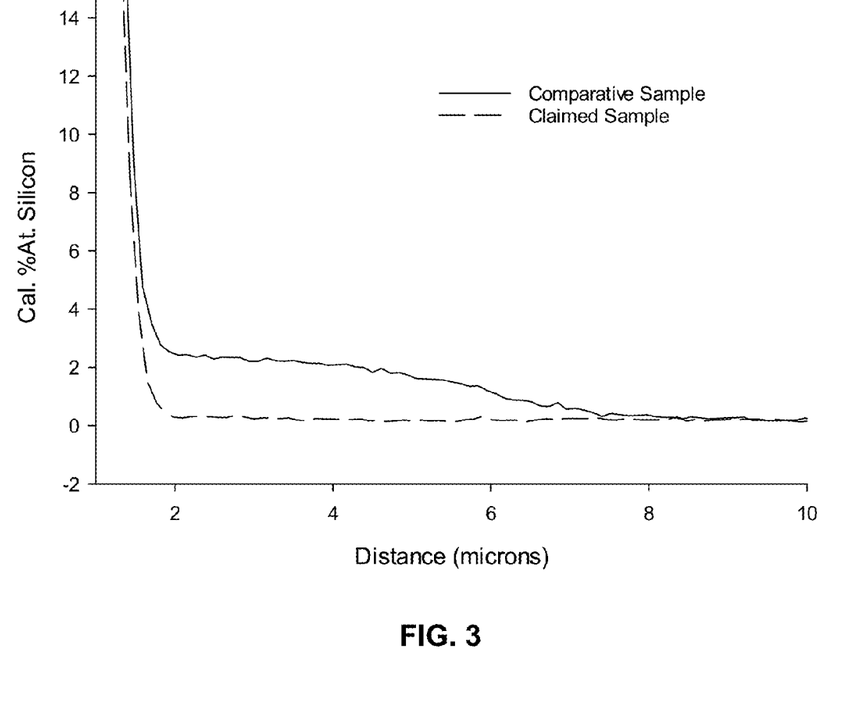
FIG. 3 is a comparison between silicon atomic percentages in the aluminum oxide layer of a comparative sample (FIG. 1) and a herein-described product (FIG. 2)
Figure 4:
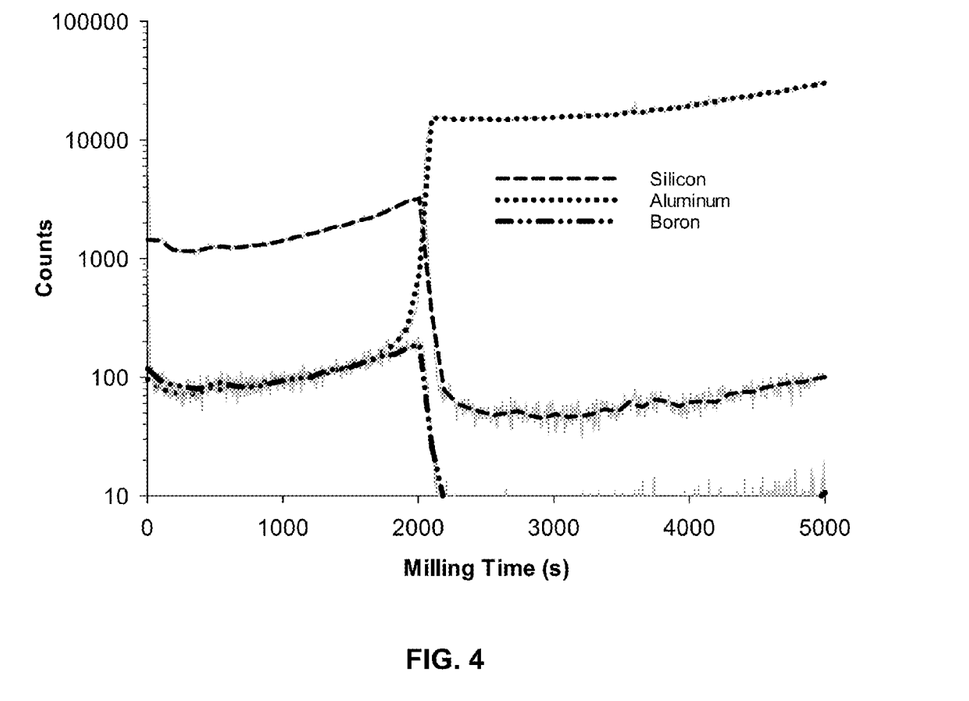
FIG. 4 is a plot of ion counts as a function of distance as determined by TOF-SIMS for a comparative product, where milling began at the surface (T=0)

The silicate glass layer can have an "EDX composition" which is the silicate glass layer composition as determined by EDX spectroscopy (see FIG. 2). Preferably, the silicate glass layer EDX composition includes silicon, oxygen and sodium. More preferably, the silicate glass layer EDX composition consists of silicon, oxygen, and elements selected from the group consisting of sodium, lithium, potassium, boron, and mixtures thereof. In various aspects, the silicate glass layer EDX composition can consist of silicon, oxygen, sodium, and boron; silicon, oxygen, lithium, and boron; silicon, oxygen, sodium, and lithium; silicon, oxygen, sodium, lithium, and boron; or silicon, oxygen, sodium, lithium, potassium, and boron. In examples where the silicate glass composition (as determined by EDX or other methods) includes boron, the silicate glass is also described as a borosilicate glass. The silicate glass layer EDX composition can further be described as consisting of silicon, oxygen, sodium, optionally lithium, and optionally boron. In some aspects, the silicate glass layer may be described as consisting of silicon, oxygen, optionally boron, sodium, and optionally lithium but may include trace amounts of potassium due to materials employed for the production of the silicate glass layer having slight impurities. Notably, the silicate glass layer may in fact include hydrogen but hydrogen is not observable by EDX spectroscopy. More preferably, the silicate glass layer EDX composition is free of aluminum.

Figure 5:
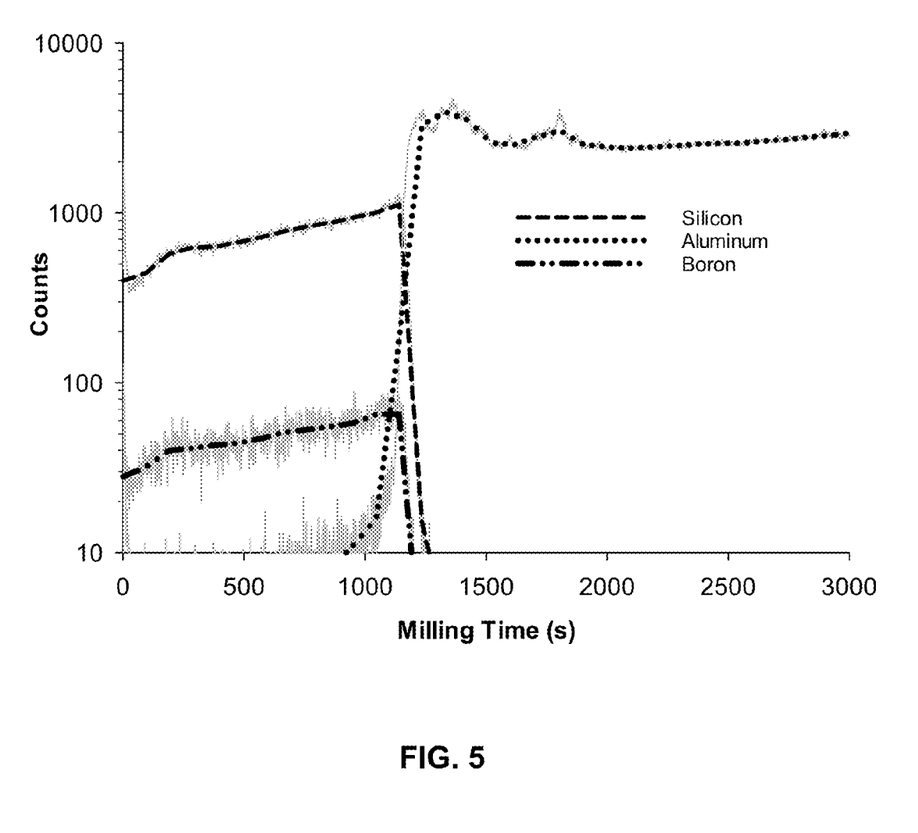
FIG. 5 is a plot of ion counts as a function of distance as determined by TOF-SIMS for a herein-described sample, where milling began at the surface (T=0)

The silicate glass layer can have a "TOF-SIMS composition" which is the silicate glass layer composition as determined by TOF-SIMS (see FIG. 5). Preferably, the silicate glass layer TOF-SIMS composition includes silicon, oxygen, and sodium. More preferably, the silicate glass layer TOF-SIMS composition consists of silicon, oxygen and elements selected from the group consisting of sodium, lithium, potassium, boron, and mixtures thereof. Notably, the silicate glass layer may include hydrogen but is not determined due to experimental difficulties and sample preparation variations. Additionally and due to the extremely high sensitivity of TOF-SIMS, the silicate glass layer TOF-SIMS composition may appear to include trace amounts of aluminum. Preferably, the silicate glass layer includes less than 0.1 wt. % aluminum, preferably less than 0.01 wt. % aluminum, even more preferably less than 0.001 wt. % aluminum.

When the silicate glass layer includes both sodium and lithium, the silicate glass layer has a Na:Li atom ratio that is preferably about 1:9 to about 9:1. More preferably, the Na:Li atom ratio is about 1:5 to about 5:1; even more preferably, about 1:2.5 to about 2.5:1.

When the silicate glass layer is a borosilicate glass layer, that is when the silicate glass layer includes boron, the silicate glass layer has a Si/B atom ratio that is, preferably, about 10:1 to about 200:1. More preferably, the Si/B ratio is about 10:1 to about 100:1; even more preferably about 25:1 to about 100:1.

The silicate glass layer can have a thickness of about 100 nm, 200 nm, 300 nm, 400 nm, 500 nm, 600 nm, 700 nm, 800 nm, 900 nm, 1000 nm, 1500 nm, 2000 nm, 2500 nm, or 3000 nm. Alternatively, the silicate glass layer thickness can be in the range of about 50 nm to about 3000 nm, about 50 nm to about 2000 nm, about 50 nm to about 1500 nm, about 100 nm to about 1500 nm, about 250 nm to about 1500 nm, or about 500 nm to about 1000 nm.

In another example, the silicate glass layer includes a mixture of alkali metals selected from a mixture of sodium and potassium; sodium, lithium and potassium; and lithium and potassium. That is, in this example the silicate glass layer includes a mixture of alkali metals wherein one alkali metal is potassium. Preferably, the silicate glass layer includes a non-homogenous distribution of potassium. For example, wherein the silicate glass layer includes a high-potassium region near the surface (away from the aluminum oxide layer), as compared to a lower-potassium concentration in a region of the silicate glass adjacent to the substrate. That is, the silicate glass can include a plurality of regions as differentiated by the depth profile of the potassium concentration.

Preferably, the concentration of the silicon in the silicate glass layer is consistent across and through the layer. The consistency of the composition can be determined from the silicon concentration in the silicate glass layer EDX composition, preferably the silicon concentration varies by less than 5%, 4%, 3%, 2%, or 1% across and through the silicon glass layer. Additionally, the concentration of oxygen in the silicate glass layer is, preferably, consistent across and through the layer. That is, the oxygen concentration in the silicate glass layer EDX composition, preferably, varies by less than 5%, 4%, 3%, 2%, or 1% across and through the silicate glass layer.

The silicate glass layer is preferably a dense, impermeable layer. More preferably, the silicate glass layer is non-porous. Even more preferably, the silicate glass layer is a transparent, amorphous solid.

As described above, the aluminum oxide layer can include about 70 wt. % to about 90 wt. % $Al_2O_3$, about 2.5 wt. % to about 7.5 wt. % $H_2O$, and about 10 wt. % to about 20 wt. % $SO_3$; about 75 wt. % to about 85 wt. % $Al_2O_3$, about 3.5 wt. % to about 5.5 wt. % $H_2O$, and about 12.5 wt. % to about 17.5 wt. % $SO_3$; or about 80-81 wt. % $Al_2O_3$, about 5-6 wt. % $H_2O$, and 14-15 wt. % $SO_3$. In alternative examples, the aluminum oxide layer can be free of $SO_3$. In one particularly preferable example, the aluminum oxide layer has an EDX composition that consists of aluminum, oxygen, sulfur, and an optional colorant. Even more preferably, the aluminum oxide layer EDX composition is free of silicon, the aluminum oxide layer EDX composition is free of nickel, the aluminum oxide layer EDX composition is free of silicon and nickel, and/or the aluminum oxide layer EDX composition is free of silicon, boron, and nickel.

Preferably, the composition of the aluminum oxide layer is consistent across and through the layer. The consistency of the composition can be determined from the aluminum concentration in the aluminum oxide layer EDX composition, preferably the aluminum concentration varies by less than 5%, 4%, 3%, 2%, or 1% across and through the aluminum oxide layer. The consistency of the composition can also be determined from the oxygen concentration in the aluminum oxide layer EDX composition, preferably the oxygen concentration varies by less than 5%, 4%, 3%, 2%, or 1% across and through the aluminum oxide layer. In examples wherein a dye is added to the aluminum oxide layer during manufacturing, the composition may vary through the layer depth due to localization of the dye in aluminum oxide pores.

The aluminum oxide layer EDX composition can include or, preferably, consists of 31-36% aluminum, 60-70% oxygen, and 2-5% sulfur; more preferably, 31-35% aluminum, 63-67% oxygen, and 3-4% sulfur; and even more preferably, 32-34% aluminum, 64-66% oxygen, and 3-3.5% sulfur. As described above, hydrogen concentrations are not available from EDX spectroscopy and therefore are not part of the EDX composition. Additionally, the aluminum oxide layer EDX composition can include an aluminum:oxygen ratio of about 1:2.

The aluminum oxide layer TOF-SIMS composition includes aluminum and oxygen. In one example, the aluminum oxide layer TOF-SIMS composition includes or, preferably, consists of aluminum, oxygen, sulfur, and an optional colorant. More preferably, the aluminum oxide layer TOF- SIMS composition is free of silicon, or free of silicon and boron (see FIG. 5). In some examples, the aluminum oxide layer TOF-SIMS composition includes sodium and/or lithium but, preferably, is substantially free of, or is free of, potassium. Notably, experimental conditions may make the observation of one or more atoms in the TOF-SIMS analysis difficult to identify—for example, the O+ mass/ion was infrequently observed at 16 amu but readily observable as the Cs ion pair, CsO+, a result of Cs ion milling.

The aluminum oxide layer can have a thickness of less than about 50 microns, 40 microns, 30 microns, 25 microns, 20 microns, 10 microns, 5 microns, 4 microns, 3 microns, 2 microns, 1 micron, or 500 nm. Preferably, the aluminum oxide thickness is a range of about 1 to about 30 microns, about 2 to about 25 microns, about 3 to about 20 microns, or about 5 to about 25 microns. In one particular example, the aluminum oxide layer has a thickness less than about 10 microns and the borosilicate glass has a thickness less than about 1 micron.

The aluminum oxide layer can include a boehmite/bayerite region without deviating from the compositional ranges provided above. Notably, the boehmite/bayerite region includes a hydrated aluminum oxide, that is, an aluminum oxide with a higher proportion of hydroxyl groups than a dehydrated $Al_2O_3$. For example, the boehmite/bayerite region includes AlO(OH) and/or $Al(OH)_3$ groups. In examples with the boehmite/bayerite region, the boehmite/bayerite region is directly attached to the silicate glass layer. In one example, the boehmite/bayerite region is within the aluminum oxide layer, with a higher proportion of hydroxyl groups, and is positioned between a region with a lower proportion of hydroxyl groups and the silicate glass layer. In another example, the boehmite/bayerite region extends through the entire aluminum oxide layer. The boehmite/bayerite region may be identified in TOF-SIMS plots of aluminum counts over time (depth) (see FIG. 5). Without being bound to theory, variation in aluminum counts at or near the silicate glass layer can be due to an increased friability of the boehmite/bayerite region compared to the majority of the aluminum oxide layer. This variation, as shown in FIG. 5 as seen between milling times of about 1300 and 2000, is believed to be or is indicative of the boehmite/bayerite region.

As noted above, this composition can include a barrier layer directly attached to the aluminum oxide layer. Preferably, the barrier layer has a TOF-SIMS composition that includes aluminum and oxygen. In some examples, the barrier layer TOF-SIMS composition further includes sodium and/or lithium. In still further examples, the barrier layer TOF-SIMS composition may include trace amounts of silicon. Notably, a friability of the barrier layer imparts a sharp increase in the number of counts in the TOF-SIMS analysis.

Preferably, the compositions include an aluminum surface carried by a substrate. The substrate can be composed of, for example, aluminum, an aluminum alloy, or stainless steel. The aluminum alloy can be selected from the series consisting of a 1000 series alloy, a 2000 series alloy, a 3000 series alloy, a 4000 series alloy, a 5000 series alloy, a 6000 series alloy, a 7000 series alloy, and 8000 series alloy. In one preferable example, the aluminum alloy is a 6000 series alloy; in another preferable example, the aluminum alloy is a 3000 series alloy; in still another example the aluminum alloy is a 1000 series alloy. The aluminum or aluminum alloy can be cast, extruded, hot rolled, cold rolled, annealed, or hardened. In one preferable instance, the aluminum or aluminum alloy is extruded. In another instance, the aluminum or aluminum alloy is rolled. In still another instance, the cast, extruded, or rolled aluminum or aluminum alloy is annealed. In yet another instance, the cast, extruded, or rolled aluminum or aluminum alloy is hardened. In other examples the substrate can be, for example, stainless steel, a ceramic, or a plastic.

An important feature is an extraordinary resistance to corrosion and or degradation provided by the herein described silicate glass coating. Generally, the resistance to corrosion or degradation is determined by the performance of test samples in the following test methods. Therein, samples are evaluated on a "pass/fail" scale; typically, passing a specific test was indicated by no change in visual appearance at the conclusion of the test whereas failure of a specific test was indicated by significant corrosion or degradation of the sample. Some tests provided less binary results; in these circumstances samples were additionally graded on a "−/0/+" scale: where "−" equates to failure, "0" equates with a minor change in appearance (e.g., light discoloration, spotting, or clouding over less than 10% of the coated surface area), and "+" equates with no change in visual appearance. Herein, samples that exhibit no visual change in appearance (score a "+") are considered to have "excelled" at the test.

In a first instance, the herein described coating provides the coated materials with resistance to acidic environments. That is, the coated product passes and/or excels on a "pH 1 Test". The "pH 1 Test" is a 10 minute immersion in an aqueous 0.1 M HCl solution at ambient temperature (20-25° C.).

In a second instance, the herein described coating provides the coated materials resistance to basic environments. That is, the coated product excels on a "pH 13.5 Test". The "pH 13.5 Test" is conducted at 25-30° C. by (a) 10 min immersion in pH 1 solution; (b) rinse in water and dry, (c) age at elevated temperature at 40° C. for 1 h, then without cooling down (d) 10 min immersion in pH 13.5 solution, and (e) rinse in water and dry. This test is commonly known as standard TL 182 (Volkswagen AG).

In another instance, the coated product passes and or excels on a 2 minute "pH 14 Test", more preferably a 10 minute "pH 14 Test", or even more preferably a 30 minute "pH 14 Test". The "pH 14 Test" is conducted by immersing the test sample in a 1 M aqueous NaOH solution at 70° C. (pH 14). The sample is held in the caustic solution for at least two minutes, thereafter removed and rinsed with water and dried. Typical failure under the pH 14 Test was a sheeting or delamination of a coating. Accordingly, samples were evaluated on a pass/fail basis wherein samples that exhibited a delamination or sheeting failed whereas samples that maintained their integrity passed. In limited samples, a slight opacity (clouding) was observed after completion of the test; in these samples were considered to have passed the test. Preferably, samples exhibited no change (e.g., no clouding, no corrosion, no change in color) in visual appearance as a result of the pH 14 Test; these samples are considered to have "excelled" under the test conditions.

Figure 6:
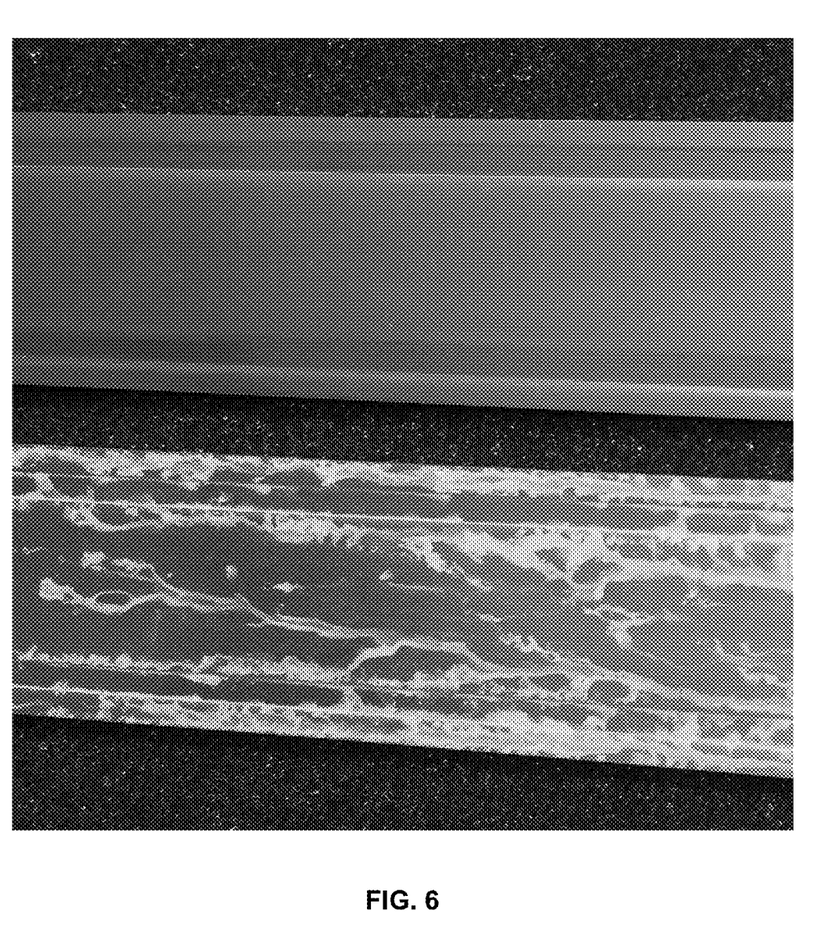
FIG. 6 is a photograph of a comparative product (prior art sample) (bottom) and a herein-described sample (top) after a 24 h CASS test.

In yet another instance, the herein described coating provides the coated materials with resistance to a Copper Accelerated Acetic Acid Salt Spray (CASS) Test (see FIG. 6). Preferably, the coated product passes a "24-hour CASS Test", a "48-hour CASS Test", a "72-hour CASS Test", and/or a "120 hour CASS Test". The "CASS Test" is a known industry standard, e.g., ASTM B368-09. Typical failure under the CASS Test is pinhole corrosion. Accordingly, samples were evaluated on a pass/fail basis, wherein samples that exhibited pinhole corrosion failed whereas samples that maintained their integrity passed. In limited samples, slight changes in visual appearance were observed; these samples were considered to have passed the test. Preferably, samples exhibited no change in visual appearance as a result of the CASS Test; these samples are considered to have "excelled" under the test conditions. Additionally, preferred samples exhibited no change in visual appearance as a result of an Extended CASS Test (48 hours).

In still yet another instance, the herein described coated product passes a "Fogging Test." The "Fogging Test" included subjecting the sample to nitric acid vapors in 95-100 percent humidity at about 38° C. for 72 hours.

A further failure test is an "abrasion test". Herein, the abrasion test included 20 cycles (40 lengths) of polishing with a Grade 1 steel wool (medium; with a fiber width of 0.06 mm) at a force of 200 g/cm$^2$. Additional abrasion testing can be conducted, e.g., an "Amtec Kistler Car Was Test" and/or a "Taber Test".

Further failure tests include a "Heat Resistance Test" (120 hours at 200° C.), a Neutral Salt Spray Test (e.g., ASTM B117; 1,000 hours), and a "Humidity Test" (300 hours). Preferably, the herein described coated product passed these test, individually and as a group.

Preferably, the herein described coated product passes a "pH 1 Test"; passes a "pH 13.5 Test", passes a 2 minute "pH 14 Test" (preferably, a 10 minute "pH 14 Test", more preferably, a 30 minute "pH 14 Test"); and passes a "24-hour CASS Test" (preferably, a "48-hour Cass Test", a "72-hour CASS Test", or a "240-hour CASS Test").

In another embodiment, the coated product includes a substrate carrying an aluminum oxide layer that is directly attached to a silicate glass layer. Here, the coated product can be free of a barrier layer, e.g., the aluminum oxide layer can be directly attached to the substrate. One example of an aluminum oxide layer directly attached to the substrate is physical vapor deposited (PVD) aluminum oxide carried by a substrate, where a PVD aluminum oxide layer was formed directly on the receiving substrate. The composition of the aluminum oxide layer (e.g., the PVD aluminum oxide layer) can be free of sulfur. Preferably, the aluminum oxide layer composition can consist of aluminum and oxygen, and more preferably, in a ratio of about 2:3 (e.g., $Al_2O_3$). In another example, the aluminum oxide layer composition can include aluminum, oxygen and hydrogen. Furthermore, the aluminum oxide layer (e.g., the PVD aluminum oxide layer) can include or consist of a bayerite/boehmite region adjacent to the silicate glass layer.

Additionally disclosed is a process for preparing the above described surface coatings or coated products. Generally, the process includes coating an aluminum oxide with an aqueous silicate solution and then polymerizing and curing a silicate glass formed from the silicate solution. An important feature of the process, alluded to above in the description of the surface coatings, is preventing silicate penetration into the aluminum oxide and preventing aluminum dissolution and appearance in the silicate glass. The control of the resulting compositions provided by the herein disclosed process yields a coating or coated product with unexpected and exceptional resistance to corrosion and damage.

At a minimum, the process can include forming an aluminum oxide layer coated with an aqueous silicate solution and then polymerizing and curing a silicate glass on the aluminum oxide layer. For a complete understanding, the process is herein described with additional, preferable, steps applicable for the formation of the above described coatings or coated products.

The herein disclosure includes a process for preparing surface coating that can include forming a coated-aluminum-oxide layer by applying an aqueous silicate solution to an aluminum oxide layer having a thickness of about 1 μm to about 25 μm, the aluminum oxide layer consisting of a sealed, anodized-aluminum layer or a hydrated PVD alumina layer, the aqueous silicate solution having a pH of about 11 to about 13, a composition that includes a ratio of $SiO_2$ to $M_2O$ of about 3.5 to about 2, where M is selected from Li, Na, K, and a mixture thereof, and a ratio of $SiO_2$ to $B_2O_3$ of about 10:1 to about 200:1; and thereafter, polymerizing and curing a silicate glass on the sealed, anodized-aluminum layer by (A) heating the coated, anodized-aluminum layer to a temperature of about 200° C. to about 500° C. or (B) exposing the coated, anodized-aluminum layer to an infrared source. The process can further include providing an aluminum surface; anodizing the aluminum surface to provide an unsealed, anodized-aluminum layer; and then hot sealing the unsealed aluminum oxide layer to provide a sealed, anodized-aluminum layer. The hot sealing can include a hot sealing time of less than 6 min/micron and at least 5 min/micron, 4 min/micron, 3 min/micron, 2 min/micron, 1 min/micron, 30 sec/micron, or 10 sec/micron; wherein forming the sealed, anodized aluminum layer from the unsealed-anodized-aluminum layer consists of the hot sealing process.

Still further, the process can includes a time between the conclusion of the hot sealing process and forming the coated, anodized-aluminum layer of less than 60, 45, 40, 35, 30, 25, 20, 15, 10 or 5 minutes. Preferably, the time is less than 5 minutes or is no more than the amount of time necessary to remove the sample from a hot sealing bath or apparatus, cool to about room temperature, and then immerse in the aqueous silicate solution (in practice, often less than 1 minute). In another instance, the sealed, anodized-aluminum layer may be held in a wet atmosphere, in water, or coated with water; before forming the coated, anodized-aluminum layer by applying the aqueous silicate solution.

Further disclosed in a multistep process that includes a first step of providing an aluminum oxide layer. The aluminum oxide layer can be prepared by anodizing aluminum or an aluminum alloy or by deposition of an aluminum oxide layer by, for example, physical vapor deposition (PVD). While chemically similar, the structures of the aluminum oxide layers provided by different methods are distinct. Anodization provides a well-known porous layer whereas PVD, typically, provides a dense non-porous layer. Prior to coating with the silicate solution, the aluminum oxide layer is, preferably, non-porous and/or includes a high proportion of hydroxyl groups on an outer surface.

The aluminum oxide layer can be provided (e.g., by anodization or PVD) on an aluminum, aluminum alloy, or other surface. In examples where the aluminum oxide layer is provided on an aluminum or aluminum alloy surface, the surface, preferably, has a <110> or a <112> orientation. In one particularly preferably instance, the aluminum or aluminum alloy surface has a <110> orientation. Notably, the aluminum or aluminum alloy surface is not single-crystalline and the surface orientation may include other crystal orientations. Herein, an aluminum or aluminum alloy that is designated as having a <110> orientation may include <100>, <111>, <211>, and <311> orientations. Preferably, the aluminum or aluminum alloy with the <110> orientation includes at least 50% <110>; more preferably 75% <110>; even more preferably, the non-<110> orientations, individually, occur as less than 20% of the surface orientation. In another example, the surface can have a <200> orientation. Preferably, the aluminum or aluminum alloy with the <200> orientation includes at least 75%, 80%, 85%, 90%, 95%, or about 100% <200> surface orientation.

The aluminum or aluminum alloy can have a coarse grain or a fine grain size (as determined by surface analysis). Preferably, the aluminum or aluminum alloy has a fine grain size. For example, the aluminum or aluminum alloy can have an average grain size of less than 500 µm, 400 µm, 300 µm, 250 µm, 200 µm, 150 µm, or 100 µm. In one example, the aluminum or aluminum alloy has an average grain size of about 250 µm, 200 µm, 150 µm, 100 µm, 75 µm, 50 µm, or 25 µm.

In one preferable example, the aluminum oxide layer is exposed to water at a temperature of at least 85° C. That is, the process can include forming a sealed, anodized-aluminum layer by a hot sealing process. The hot sealing process includes exposing the anodized aluminum, preferably, a hard-anodized-aluminum layer, to water at a temperature of at least 85° C., 90° C., 95° C., 98° C., 99° C., 100° C., or 101° C. In one instance, hard-anodized aluminum can be hot sealed in boiling or near boiling water; in another instance the hard-anodized aluminum can be steam sealed. Preferably, anodized aluminum is hot sealed in boiling or near boiling water. The water is preferably free of silicates and transition metals (e.g., nickel), and/or other sealing additives. The hot sealing of the hard-anodized-aluminum layer can include exposing the hard-anodized aluminum to hot water for at least 5 min/micron, 4 min/micron, 3 min/micron, 2 min/micron, 1 min/micron, 30 sec/micron, or 10 sec/micron. The process can, alternatively, include exposing a PVD alumina layer to water at a temperature of at least 85° C., 90° C., 95° C., 98° C., 99° C., 100° C., or 101° C. to form a hydrated PVD alumina. In one instance, the PVD alumina layer can be exposed to boiling or near boiling water; in another instance the PVD alumina layer can be exposed to steam. Preferably, the PVD alumina layer is exposed to boiling or near boiling water, where the water is free of silicates, transition metals, and/or sealing additives. Alternatively, a high hydroxyl content aluminum oxide layer can be provided by PVD (e.g., PVD of a boehmite/bayerite layer). Preferably, the process includes forming aluminum hydroxides on exposed surface of the aluminum oxide layer during the exposure of the materials to water at a temperature of at least 85° C. Optionally, the process can include forming aluminum hydroxides within the aluminum oxide layer. More preferably, the process includes forming a boehmite/bayerite region in the aluminum oxide layer.

The aluminum oxide layer (e.g., the sealed, anodized aluminum layer or the hydrated PVD alumina layer) can have a thickness of about 1 µm to about 50 µm. Specifically, the aluminum oxide layer can have a thickness of less than about 50 microns, 40 microns, 30 microns, 25 microns, 20 microns, 10 microns, 5 microns, 4 microns, 3 microns, 2 microns, 1 micron, or 500 nm. Preferably, the aluminum oxide thickness is within a range of about 1 to about 30 microns, about 2 to about 25 microns, about 3 to about 20 microns, or about 5 to about 25 microns. In one particular example, the aluminum oxide layer has a thickness less than about 10 microns.

In a specific example, the aluminum oxide layer is a sealed, anodized-aluminum layer which has a composition that is free of silicates, preferably, free of silicon and, more preferably, free of nickel. For example, the sealed, anodized-aluminum layer can have a composition that includes or consists of about 75 wt. % to about 85 wt. % $Al_2O_3$, about 3.5 wt. % to about 5.5 wt. % $H_2O$, and about 12.5 wt. % to about 17.5 wt. % $SO_3$. In another specific example, the aluminum oxide layer is a hydrated PVD alumina layer which has a composition that includes or, preferably, consists of aluminum, oxygen and hydrogen.

The process can then include coating the aluminum oxide layer with an aqueous silicate solution; that is, forming a coated, aluminum oxide layer, where the aluminum oxide layer carries a layer/coating of an aqueous silicate solution. For example, the coated, aluminum oxide layer can be a coated, anodized-aluminum layer or a coated PVD alumina layer. In one particularly preferable example, the process includes applying an aqueous silicate solution to the sealed, anodized-aluminum layer. Alternatively, the process can include applying the aqueous silicate solution to a hydrated PVD layer. Preferably, the aqueous silicate solution is maintained at a temperature below 30° C., 25° C., or 20° C.

The coated aluminum oxide layer preferably includes or consists of the aluminum oxide layer (e.g., the sealed, anodized-aluminum layer) and a silicate solution layer. The silicate solution layer can have a thickness of about 0.1 µm to about 5 µm, about 0.5 µm to about 4 µm, or about 1 µm to about 3 µm.

The aqueous silicate solution has a pH of about 11 to about 13, about 11 to about 12, or about 11 to about 11.5. Preferably, the aqueous silicate solution has a composition that includes a ratio of $SiO_2$ to $M_2O$ of about 3.5 to about 2, about 3.5 to about 2.25, about 3.5 to about 2.5, about 3.5 to about 2.75, or about 3.5 to about 3, where M is selected from Li, Na, K, and a mixture thereof. More preferably, the aqueous silicate solution has a composition that includes a ratio of $SiO_2$ to $B_2O_3$ of about 10:1 to about 200:1.

In one instance, the coating process can include immersing the aluminum oxide layer in the aqueous silicate solution and then withdrawing the coated, anodized-aluminum layer from the aqueous silicate solution. In another instance, the coating process can include spray coating or roll coating the aluminum oxide layer with the aqueous silicate solution.

The coating process, preferably, excludes the formation of aluminosilicates. More preferably, the process includes preventing the formation of an aluminosilicate. In one example, preventing the formation of aluminosilicate can include preventing the penetration of the aqueous silicate solution into aluminum oxide layer. More preferably, preventing the formation of the aluminosilicate includes preventing the dissolution of aluminum from the aluminum oxide layer into the aqueous silicate solution. For example, the coating process prevents the diffusion of the silicate into the alumina and/or the interdiffusion of the silicate and alumina thereby providing a product that is free of an aluminosilicate or silicate/alumina interdiffusion. Processes for preventing the penetration of the aqueous silicate solution into the aluminum oxide layer can include sealing pores in the aluminum oxide layer to reduce silicate solution penetration and thereby formation of interstitial Al/Si layers, providing a non-porous aluminum oxide layer, and/or rapidly drying the aqueous silicate solution to reduce or eliminate the mobility of the silicon atoms. Processes for preventing the dissolution of aluminum from the aluminum oxide layer into the aqueous silicate solution can include incompletely hydrating the aluminum oxide layer or reducing the percentage of $Al(OH)_3$ in the aluminum oxide layer, conducting the coating process at a reduced temperature (e.g., by chilling the aqueous silicate solution and/or the aluminum oxide layer), and/or rapidly drying the aqueous silicate solution. In one example, the process can include preheating the coated, anodized-aluminum layer to a temperature of about 30° C. to about 100° C. immediately after the formation of the coated aluminum oxide layer. In another example, the process can include drying the coated, anodized-aluminum layer immediately after the formation of the coated aluminum oxide layer. In another example, the process can include reducing a water content in the coated, anodized-aluminum layer by at least 25%, 50%, or 75% immediately after the formation of the coated aluminum oxide layer.

The process, preferably, further includes quickly applying the aqueous silicate solution to the aluminum oxide layer after hot sealing (i.e. exposing the aluminum oxide layer to the hot water). For example, the process can include forming a coated, anodized-aluminum layer by applying the aqueous silicate solution within 45, 40, 35, 30, 25, 20, 15, 10 or 5 minutes of a conclusion of the hot sealing process. That is, the process can include immersing the sealed, anodized-aluminum layer in the aqueous silicate solution; or spray coating or roll coating the sealed, anodized-aluminum layer with the aqueous silicate solution within 45, 40, 35, 30, 25, 20, 15, 10 or 5 minutes of a conclusion of the hot sealing process. In another example, the process can include forming a coating PVD alumina layer by applying the aqueous silicate solution within 45, 40, 35, 30, 25, 20, 15, 10 or 5 minutes of removal from exposure to water at a temperature of at least 85° C.

Alternatively, the process can include holding or maintaining the hot sealed aluminum oxide layer in an atmosphere with a relative humidity of at least 50%, 60%, 70%, 80%, 90%, or about 100% prior to coating the aluminum oxide layer with the aqueous silicate solution. For example, a sealed, hard-anodized aluminum layer can be maintained in an atmosphere with a relative humidity of at least 50%, 60%, 70%, 80%, 90%, or about 100% for a period longer than 45 min, 1 h, 2 h, 3 h, or 4 h, and then coating with an aqueous silicate solution. In another example, the process can include holding or maintaining the hot water exposed aluminum oxide layer in water and then coating with an aqueous silicate solution. Preferably, the aluminum oxide layer is held in water at a temperature of less than 75° C., 65° C., 60° C., 55° C., 50° C., 45° C., 40° C., 35° C., 30° C., 25° C., or 20° C. For example, the process can include holding, maintaining, or submerging the sealed, anodized-aluminum layer in water; and then forming the coated, anodized-aluminum layer by applying the aqueous silicate solution.

The coated, aluminum oxide layer includes an aqueous solution of an alkali metal silicate carried on the surface of an aluminum oxide. Without being bound to theory, the dried, coated, aluminum oxide layer can include sufficient water to allow for the dissolution of the alkali metal silicate from the aluminum oxide layer. That is, prior to a polymerization and curing step, the alkali metal silicate carried on the surface of the aluminum oxide layer can be dissolved or removed from the surface by, for example, washing the surface in water or an alkali solution (e.g., 0.01 $M^{aq}$ NaOH, or 0.1 $M^{aq}$ NaOH).

An important step in the preparation of the coated/corrosion resistant product is the polymerization and curing of a silicate glass. The silicate glass can be formed from the heating and dehydration of an aqueous solution of an alkali metal silicate carried on the surface of the aluminum oxide layer. Alternative, the silicate glass can be formed by the infrared activation of the aqueous solution of alkali metal silicate carried on the surface of the aluminum oxide layer.

In one example, the heating of the coated, aluminum oxide layer facilitates the removal of water from the coating, dehydration-polymerization of $SiO_4$ groups, and the curing of the silicate glass. For example, the process can include polymerizing and curing a silicate glass by heating the coated, anodized-aluminum layer to a temperature of about 200° C. to about 500° C. The polymerization and curing temperature can be in the range of about 200° C. to about 500° C., preferably this temperature is about 200° C. to about 400° C., about 250° C. to about 350° C., about 260° C. to about 325° C., or about 260° C. to about 300° C. More preferably, the polymerizing and curing of the silicate glass includes heating the surface of the substrate, i.e., the coated, anodized-aluminum layer, to a temperature of about 240° C. to about 320° C., about 260° C. to about 300° C., about 270° C. to about 290° C., or about 280° C.

Figure 7:
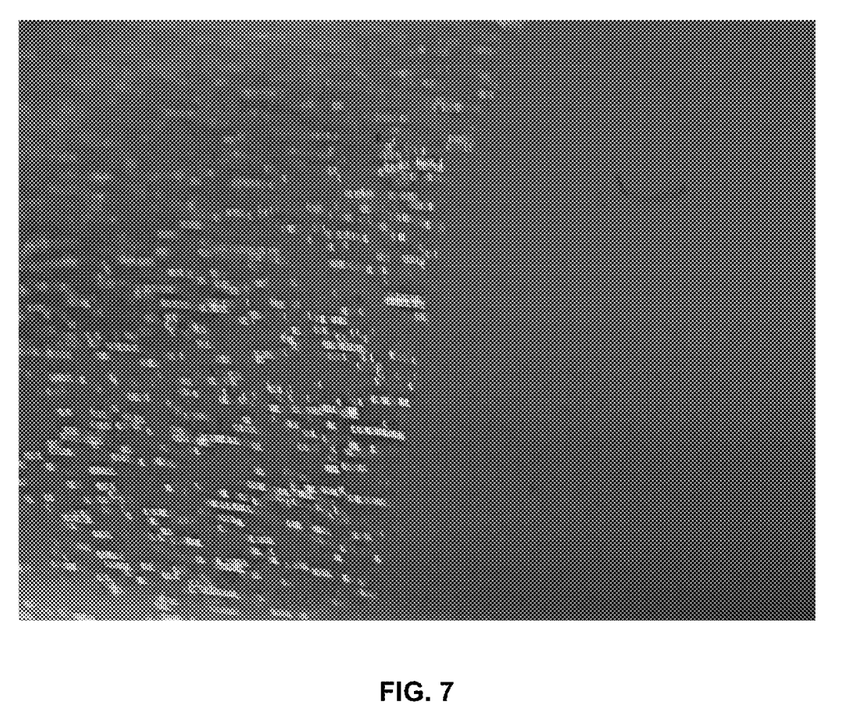
FIG. 7 is a photograph of a partially coated sample after heating to 280° C. for 15 minutes, the photograph (Left) showing cracking and/or crazing of an uncoated sealed anodized aluminum layer and (Right) showing the undamaged coated section.

The polymerization and curing of the silicate glass preferably includes the rapid heating and dehydration of the aqueous alkali metal silicate. Unexpectedly, the coated, aluminum oxide layer is resistant to the well-known cracking and/or crazing of the surface caused by the rapid heating and/or dehydration of the aluminum oxide layer (see FIG. 7). Whereas aluminum oxide layers would crack, craze, or delaminate; the coated, aluminum oxide layer can be heated to the polymerization and curing temperature a rate of 1° C./s, 10° C./s, 25° C./s, 50° C./s, or 100° C./s; or a rate of at least 10° C./s, 25° C./s, 50° C./s, or 100° C./s. Whereas visual identification of cracking, crazing, or delamination is readily apparent, damages surfaces are mopre readily identifies by failure of the herein described test methods (e.g., the "pH 1 Test", the "pH 14 Test", or the "CASS Test"). In one preferable example, the polymerization and curing of the silicate glass includes the heating of the silicate layer (solution/glass) but incomplete heating of the underlying substrate.

The heating and dehydration of the aqueous silicate solution carried on the surface of the aluminum oxide layer can be accomplished by, for example, direct heating in an oven, heating by lamps, a vacuum process, or a combination thereof. In one preferable example, the coated, aluminum oxide layer is heated in an oven. In one instance, the coated, aluminum oxide layer is heated in a conventional oven. In another instance, the coated, aluminum oxide layer is heated in a convection oven that allows for the more rapid and even elevation of the temperature of the coated, aluminum oxide layer. In yet another instance, the coated, aluminum oxide layer is carried through a heating zone (e.g., in a conveyor oven). Even more preferably, the coated, aluminum oxide is heated to the polymerization and curing temperature at a rate of at least 20° C./s, is heated for a heating time of less than about 30 min, and is then removed from the heat source to a temperature of less than 50° C., 40° C., or 30° C., preferably removed from the heat source to a temperature of about 20-25° C. (standard room temperatures). Preferably, the direct heating is for a heating time of less than about 5 min, 10 min, 15 min, 20 min, 25 min, or 30 min. More preferably, the heating time is less than about 15 min.

In another example, the silicate glass can be formed by the infrared activation of the alkali metal silicate layer carried on the surface of the aluminum oxide layer. For example, the coated, aluminum oxide layer can be polymerized and the silicate glass cured by exposing the coated, anodized-aluminum layer to an infrared (IR) source. In one instance, the coated, aluminum oxide layer is exposed to IR heat lamps (e.g., short wave or mid wave lamps). In another instance the coated, aluminum oxide layer is carried through an IR exposure region (e.g., on a conveyor). The IR transmission from the IR source can be from about 1 to about 3 μm (short wave IR), from about 3 to about 5 μm (mid wave IR, or intermediate IR), or from about 2 to about 4 μm (IR-B). Preferably, the IR exposure is for an exposure time of less than about 15 seconds, 30 seconds, 45 seconds, 60 second, 90 seconds, 120 seconds, 3 min, 4 min, 5 min, or 10 min. More preferably, exposure time of less than about 15 seconds, 30 seconds, 45 seconds, 60 second, 90 seconds, or 120 seconds.

Unexpectedly, the IR cured, silicate glass is resistant to the well-known cracking and/or crazing of the surface. Whereas aluminum oxide layers crack, craze, or delaminate; the coated, aluminum oxide layer can be exposed to the IR source and the resultant cured silicate glass appears as a uniform unbroken surface (see FIG. 7). Whereas visual identification of cracking, crazing, or delamination is often visually apparent, damaged surfaces are more readily identified by failure of the herein described test methods (e.g., the "pH 1 Test", the "pH 14 Test", and/or the "CASS Test"). Herein, the products carrying the IR cured silicate glass pass the "pH 1 Test", the "pH 14 Test", and the "CASS Test".

In one specific example, the process of preparing a surface coating can consist of forming a coated, anodized-aluminum layer by dip coating, spray coating, or roll coating a sealed, anodized-aluminum layer having a thickness of about 1 μm to about 25 μm with an aqueous silicate solution. The coated, anodized-aluminum layer can consist of the sealed, anodized-aluminum layer and a silicate solution layer, where the silicate solution layer has a thickness of about 1 μm to about 3 μm, and the sealed, anodized-aluminum layer has a composition that includes about 75 wt. % to about 85 wt. % $Al_2O_3$, about 3.5 wt. % to about 5.5 wt. % $H_2O$, and about 12.5 wt. % to about 17.5 wt. % $SO_3$, and is free of nickel and silicon. The process thereafter includes polymerizing and curing the coated, anodized-aluminum layer to form a non-porous silicate glass, the polymerizing and curing includes heating the coated, anodized-aluminum layer to a temperature of about 225° C. to about 300° C. Wherein, the above described thickness, composition, and heating features can be further refined by the corresponding general disclosures.

In another specific example, the process can consist of hot sealing an anodized aluminum layer by exposing the anodized aluminum layer to water at a temperature of at least 85° C., 95° C., or 100° C. The process thereafter includes either (A) forming a coated, anodized-aluminum layer by dip coating, spray coating, or roll coating the sealed, anodized-aluminum layer with an aqueous silicate solution within 20, 15, 10 or 5 minutes of a conclusion of the hot sealing process, or (B) maintaining the sealed, anodized-aluminum layer in water after the hot sealing process and then forming the coated, anodized-aluminum layer by dip coating, spray coating, or roll coating with the aqueous silicate solution. Herein, the sealed, anodized-aluminum layer has a thickness of about 1 μm to about 25 μm, the coated, anodized-aluminum layer consists of the sealed, anodized-aluminum layer and a silicate solution layer that has a thickness of about 1 μm to about 3 μm, and the sealed, anodized-aluminum layer has a composition that includes about 75 wt. % to about 85 wt. % $Al_2O_3$, about 3.5 wt. % to about 5.5 wt. % $H_2O$, and about 12.5 wt. % to about 17.5 wt. % $SO_3$, and is free of nickel and silicon. Thereafter, the process includes polymerizing and curing the coated, anodized-aluminum layer to form a non-porous silicate glass, the polymerizing and curing includes heating the coated, anodized-aluminum layer to a temperature of about 225° C. to about 300° C. Wherein, the above described thickness, composition, and heating features can be further refined by the corresponding general disclosures.

In yet another specific example, the process of preparing a surface coating can consist of forming a coated, PVD alumina layer by dip coating, spray coating, or roll coating a PVD alumina layer having a thickness of about 1 μm to about 25 μm with an aqueous silicate solution. The coated, PVD alumina layer can consist of the PVD alumina layer and a silicate solution layer, where the silicate solution layer has a thickness of about 1 μm to about 3 μm. The process thereafter includes polymerizing and curing the coated, PVD alumina layer to form a non-porous silicate glass, the polymerizing and curing includes heating the coated, PVD alumina layer to a temperature of about 225° C. to about 300° C. Wherein, the above described thickness, composition, and heating features can be further refined by the corresponding general disclosures.

EXAMPLES

By way of example and not limitation, test samples, prepared as follows, are illustrative of various embodiments of the present disclosure and further illustrate experimental testing conducted.

The herein described aqueous silicate solution can be an alkali-borosilicate solution containing a mixture of sodium and lithium metal counterions. The alkali-borosilicte solution can be prepared by combining concentrated, commercial, liquid sodium silicate and lithium silicate solutions. Then adding to this lithium-sodium solution a borax solution (sodium tetraborate decahydrate ($Na_2B_4O_7 \cdot 10H_2O$) in water). The final borax concentration in the coating solution can be between 1-5% by weight. In one example, the aqueous silicate solution contains 13.0% $SiO_2$, 1.7% $Na_2O$, 1.2% $Li_2O$, 1.1% $B_2O_3$, and 83.0% $H_2O$ by weight, had a specific gravity of about 1.15. Prior to use, the solution was filtered through a 1.2 mm filter. The aqueous silicate solution has a specific gravity of 1.136 and was held at 20° C.

The following general procedures were used to produce test samples:

Anodization: Component testing was conducted on automotive-trim test forms which were produced by extruding and heat treating a 6061 series aluminum alloy. The test forms were approximately 100 mm by 500 mm and included a multitier cross-sectional profile. The aluminum form was degreases (alkaline), desmutted (nitric acid), and then anodized in a sulfuric acid bath at 19° C., for 15 min, at 16V and 1.5 A/$dm^2$. The anodized sample was then rinsed three times with DI water. This yielded an unsealed, anodized-aluminum layer carried on the aluminum form.

Hot Sealing: following anodization and unless otherwise noted, test samples were hot sealed at about 97° C. following standard industrial procedures. A test standard was established with a hot sealing time of 2 minutes per micron of anodization (e.g., 20 minutes for a 10 micron thick anodized layer).

Coating: test samples (hot sealed or not) were coated with aqueous silicate solution by immersion, spray coating, or roll coating to provide a coating thickness of about 1 μm to about 5 μm. Preferably, test samples were immersed in the aqueous silicate solution for five minutes. Unless otherwise noted the aqueous silicate solution was the above described alkali-borosilicate solution.

Polymerizing and Curing: coated test samples were subjected to elevated temperatures to polymerize and cure the silicate coatings. The temperatures can be applied by standard, convection, or IR oven. The curing times (time subjected to elevated temperatures) ranged from about 3 to 30 minutes. No benefit was incurred by heating beyond 30 minutes.

Test samples were subjected to the following testing: a 24 hour CASS test, a 2 minutes pH 14 test, a fogging test, and an abrasion test. Table 1 provides data on the preparation of prior art comparative samples:

| Sample Number | Seal | Anodize to Coat Time | Coating Type | Curing Time[1] | Ref. |
|---|---|---|---|---|---|
| C1 | None | 0 | ABS[2] | 3 min | Jennings[3] |
| C2 | None | 0 | ABS[2] | 7 min | Jennings[3] |
| C3 | None | 0 | ABS[2] | 15 min | Jennings[3] |
| C4 | None | 0 | ABS[2] | 30 min | Jennings[3] |
| C5 | 800 sec Cold then 800 sec Hot | 0 | 0.5 wt. % sodium silicate | 0 | Lawlor[4] |

[1]Time at a curing temperature of 280° C.
[2]The above described alkali-borosilicate solution.
[3]U.S. Pat. No. 8,173,221
[4]U.S. Pat. No. 7,851,025

Table 2 provides data on the preparation of comparative samples that can be viewed as amendments on the prior art:

| Sample Number | Seal | Anodize to Coat Time | Coating Type | Curing Time[1] | Ref. |
|---|---|---|---|---|---|
| C6 | None | 5 h | ABS[2] | 15 min | Jennings[3] |
| C7 | None | 24 h | ABS[2] | 15 min | Jennings[3] |
| C8 | 800 sec Cold then 800 sec Hot | 0 | ABS[2] | 15 min | Lawlor[4] |

[1]Time at a curing temperature of 280° C.
[2]The above described alkali-borosilicate solution.
[3]U.S. Pat. No. 8,173,221
[4]U.S. Pat. No. 7,851,025

Table 3 provides data on the preparation of herein disclosed samples using the above described alkali-borosilicate solution:

| Sample | Hot Seal[1] | Seal to Coat Time[2] | Curing Time[3] |
|---|---|---|---|
| 1 | 0.5 | 0 | 15 |
| 2 | 2 | 0 | 15 |
| 3 | 6 | 0 | 15 |
| 4 | 2 | 5[4] | 15 |
| 5 | 2 | 24[4] | 15 |
| 6 | 2 | 5[5] | 15 |
| 7 | 2 | 24[5] | 15 |
| 8 | 2 | 0 | 3 |
| 9 | 2 | 0 | 7 |
| 10 | 2 | 0 | 30 |

[1]Hot seal time in minutes per micron of anodized layer thickness.
[2]The time in hours between hot sealing and coating with the alkali-borosilicate solution.
[3]Time at a curing temperature of 280° C.
[4]Samples were maintained in air at room temperature for the time between hot sealing and coating.
[5]Samples were maintained in water at room temperature for the time between hot sealing and coating.

Table 4 provides test results for all samples.

| Sample Number | 24 hour CASS | 2 min pH 14 | Fogging | Abrasion |
|---|---|---|---|---|
| C1 | F | P(0) | F | P(0) |
| C2 | F | P(+) | F | P(0) |
| C3 | F | P(+) | P(0) | P(0) |
| C4 | F | P(+) | P(+) | P(0) |
| C5 | F | F | F | F |
| C6 | F | P(0) | P(0) | P(0) |
| C7 | F | P(0) | P(0) | P(0) |
| C8 | F | P(+) | F | P(0) |
| 1 | P(+) | P(+) | P(+) | P(+) |
| 2 | P(+) | P(+) | P(+) | P(+) |
| 3 | P(0) | P(0) | P(+) | P(+) |
| 4 | P(0) | F | P(0) | P(0) |
| 5 | P(0) | F | P(0) | P(0) |
| 6 | P(0) | P(0) | P(0) | F |
| 7 | P(0) | P(0) | P(0) | F |
| 8 | P(+) | P(0) | F | P(0) |
| 9 | P(0) | P(+) | P(0) | P(0) |
| 10 | P(+) | P(+) | P(+) | P(+) |

TOF-SIMS testing: Comparative Sample 3 (unsealed) and Sample 2 (sealed) were ion milled and compositional analysis was completed by time-of-flight secondary ion mass spectroscopy (TOF-SIMS). Milling distances were approximately 1 micron per cycle. Table 5 provides atomic percentages of Silicon and Aluminum (balance Oxygen):

| Milling Cycle | Comparative Sample C3 | | Sample 2 | |
|---|---|---|---|---|
| | Si | Al | Si | Al |
| 1 | 29.4 | 0.9 | 30.0 | 1.4 |
| 2 | 28.6 | 0.1 | 29.3 | 0.1 |
| 3 | 28.5 | 0.1 | 29.3 | 0.2 |
| 4 | 28.3 | 0.0 | 3.2 | 29.3 |
| 5 | 28.7 | 0.2 | 0.0 | 34.0 |
| 6 | 1.4 | 31.7 | 0.0 | 33.8 |
| 7 | 1.3 | 32.9 | 0.0 | 34.2 |
| 8 | 0.6 | 32.7 | 0.0 | 34.3 |
| 9 | 0.4 | 33.2 | 0.0 | 34.9 |
| 10 | 0.4 | 33.1 | 0.0 | 34.4 |
| 11 | 0.8 | 33.3 | 0.0 | 34.8 |
| 12 | 1.0 | 32.7 | 0.0 | 34.9 |
| 13 | 0.6 | 33.0 | 0.0 | 34.7 |
| 14 | 0.4 | 33.7 | 0.0 | 90 |
| 15 | 0.5 | 33.2 | 0.0 | 100 |
| 16 | 0.5 | 37.9 | 0.0 | 100 |
| 17 | 0.0 | 99.5 | 0.0 | 99.7 |
| 18 | 0.0 | 99.8 | 0.0 | 100 |

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

What is claimed:

1. A layered product comprising:
   a substrate selected from the group consisting of aluminum and an aluminum alloy,
   an anodized-aluminum layer, having a composition that is free of silicates, carried by the substrate;
   wherein the anodized-aluminum layer is a hot-sealed, anodized aluminum layer; and
   a silicate glass layer directly carried by the anodized aluminum layer, having a silicate glass layer composition that consists of silicon, oxygen, sodium, lithium and boron.

2. The layered product of claim 1, wherein the anodized-aluminum layer has an EDX composition that is free of boron, and/or nickel.

3. The layered product of claim 1, wherein the silicate glass layer has a composition that consists of about 55 wt. % to about 98 wt. % $SiO_2$, 0 wt. % to about 6.7 wt. % $B_2O_3$, and about 2.3 wt. % to about 36 wt. % $M_2O$, wherein M is a mixture of lithium and sodium.

4. The layered product of claim 1, wherein the silicate glass layer has a thickness in the range of about 50 nm to about 3000 nm.

5. The layered product of claim 1, wherein the anodized-aluminum layer has a EDX composition that consists of aluminum, oxygen, sulfur, and an optional colorant.

6. The layered product of claim 1, wherein the anodized-aluminum layer has a TOF-SIMS composition that consists of aluminum, oxygen, sulfur, and an optional colorant.

7. The layered product of claim 1, wherein the layered product is free of an aluminosilicate or silicate/alumina interdiffusion.

8. The layered product of claim 1, wherein the product passes a 2 minute "pH 14 Test" and a "24-hour CASS Test".

9. A layered product comprising:
a substrate selected from the group consisting of aluminum and an aluminum alloy,
an anodized-aluminum layer carried by the substrate, the anodized aluminum layer having a non-porous, hot sealed aluminum oxide surface distal from the substrate; and
a borosilicate glass layer directly carried by the non-porous, hot-sealed aluminum oxide surface, having a borosilicate glass layer composition that consists of silicon, oxygen, sodium, lithium and boron.

10. The layered product of claim 9, wherein the layered product passes a 2 minute "pH 14 Test" and a "24-hour CASS Test".

11. An aluminum part having a corrosion resistant surface; the corrosion resistant surface comprising:
an aluminum or an aluminum alloy surface;
a hot-sealed, anodized-aluminum layer carried by the aluminum or aluminum alloy surface; and
a borosilicate glass layer carried directly by the hot-sealed, anodized-aluminum layer, having a borosilicate glass layer composition that consists of silicon, oxygen, sodium, lithium and boron; and
wherein the corrosion resistant surface of the aluminum part passes a 2 minute "PH 14 Test" and a "24-hour CASS Test".

* * * * *